(12) United States Patent
Rozen et al.

(10) Patent No.: US 11,646,199 B2
(45) Date of Patent: May 9, 2023

(54) SUB-STOICHIOMETRIC METAL-OXIDE THIN FILMS

(71) Applicants: International Business Machines Corporation, Armonk, NY (US); ULVAC, Inc., Kanagawa (JP)

(72) Inventors: John Rozen, Hastings on Hudson, NY (US); Martin Michael Frank, Dobbs Ferry, NY (US); Yohei Ogawa, White Plains, NY (US)

(73) Assignees: International Business Machines Corporation, Armonk, NY (US); ULVAC. Inc., Chigasaki (JP)

( * ) Notice: Subject to any disclaimer, the term of this patent is extended or adjusted under 35 U.S.C. 154(b) by 198 days.

(21) Appl. No.: 17/323,178

(22) Filed: May 18, 2021

(65) Prior Publication Data
US 2021/0272796 A1    Sep. 2, 2021

Related U.S. Application Data

(62) Division of application No. 16/516,423, filed on Jul. 19, 2019, now Pat. No. 11,081,343.

(51) Int. Cl.
*H01L 21/02* (2006.01)
*H01L 21/28* (2006.01)
(Continued)

(52) U.S. Cl.
CPC ........ *H01L 21/0228* (2013.01); *C23C 16/405* (2013.01); *C23C 16/45527* (2013.01);
(Continued)

(58) Field of Classification Search
CPC ........... H01L 21/0228; H01L 21/02244; H01L 45/146; H01L 21/02181; H01L 21/02183;
(Continued)

(56) References Cited

U.S. PATENT DOCUMENTS

| 7,030,042 B2 | 4/2006 | Vaartstra et al. |
| 7,560,395 B2 | 7/2009 | Ahn et al. |

(Continued)

FOREIGN PATENT DOCUMENTS

WO    2012120238 A1    9/2012

OTHER PUBLICATIONS

Sokolov et al. ("Influence of oxygen vacancies in ALD HfO2-x thin films on non-volatile resistive switching phenomena with a Ti/HfO2-x/Pt structure," Applied Surface Science 434, pp. 822-830, 2018) (Year: 2018).*

(Continued)

*Primary Examiner* — Yasser A Abdelaziez
(74) *Attorney, Agent, or Firm* — Cantor Colburn LLP; Robert Sullivan

(57) ABSTRACT

Embodiments of the present invention are directed to forming a sub-stoichiometric metal-oxide film using a modified atomic layer deposition (ALD) process. In a non-limiting embodiment of the invention, a first precursor and a second precursor are selected. The first precursor can include a metal and a first ligand. The second precursor can include the same metal and a second ligand. A substrate can be exposed to the first precursor during a first pulse of an ALD cycle. The substrate can be exposed to the second precursor during a second pulse of the ALD cycle. The second pulse
(Continued)

can occur directly after the first pulse without an intervening thermal oxidant. The substrate can be exposed to the thermal oxidant during a third pulse of the ALD cycle.

17 Claims, 12 Drawing Sheets

(51) Int. Cl.
    *H01L 45/00* (2006.01)
    *C23C 16/40* (2006.01)
    *C23C 16/455* (2006.01)
    *H01L 29/51* (2006.01)

(52) U.S. Cl.
    CPC .. *H01L 21/02244* (2013.01); *H01L 21/02255* (2013.01); *H01L 29/40114* (2019.08); *H01L 45/1616* (2013.01); *H01L 45/1633* (2013.01); *H01L 29/517* (2013.01); *H01L 45/146* (2013.01)

(58) Field of Classification Search
    CPC ... H01L 27/249; H01L 45/04; H01L 45/1226; H01L 29/40114; H01L 21/02255; H01L 45/1616; H01L 45/1633; H01L 29/517; C23C 16/405; C23C 16/45527
    See application file for complete search history.

(56) References Cited

U.S. PATENT DOCUMENTS

| | | | |
|---|---|---|---|
| 7,691,758 B2 | 4/2010 | Iwaki | |
| 8,016,945 B2 | 9/2011 | Zilbauer et al. | |
| 8,685,815 B2 | 4/2014 | Ahn et al. | |
| 9,677,173 B2 | 6/2017 | Hatanpaa et al. | |
| 2005/0000794 A1 | 1/2005 | Demaray et al. | |
| 2005/0070126 A1 | 3/2005 | Senzaki | |
| 2007/0092734 A1 | 4/2007 | Durandeau et al. | |
| 2010/0193955 A1* | 8/2010 | Milligan | H01L 21/28088 438/653 |
| 2013/0011557 A1 | 1/2013 | Farm et al. | |
| 2014/0318611 A1 | 10/2014 | Moslehi et al. | |
| 2015/0380309 A1* | 12/2015 | Mujumdar | H01L 21/0228 257/734 |
| 2016/0056037 A1* | 2/2016 | Thombare | H01L 21/324 438/770 |

OTHER PUBLICATIONS

W.-M. Li., "Recent Developments of Atomic Layer Deposition Process for Metallization," Chem. Vap. Deposition 19, (2013): pp. 82-103.

Bonvalot et al.,"AA-MoA-15 Monitoring Resistive Switching Properties of ALD Grown Al2O3/HfO2 Nanolaminate ReRAM Structures by iin-situ Reducing Plasma Treatments" ALD conference proceedings (2017): 2 pages.

Egorov et al., "AA-MoA-14 Plasma-Enhanced Atomic Layer Deposition of Oxygen Deficient TaOx Thin Films for Resistive Switching Memory Applications" ALD conference proceedings (2017): 2 pages.

I. G. Baek et al., "Realization of vertical resistive memory (VRRAM) using cost effective 3D process," International Electron Devices Meeting, 2011, 31.8, pp. 737-740.

IBM "List of IBM Patents or Patent Applications Treated as Related; (Appendix P)", Filed May 18, 2021, 2 pages.

International Search Report; International Application No. PCT/IB2020/056508 ; International Filing Date: Oct. 7, 2020; dated Oct. 21, 2020 ; 11 pages.

Ji-Hoon Ahn et al., "Enhanced electrical properties of Hf-aluminate thin films by crystal structure modulation," Materials Letters, vol. 157, 2015, pp. 215-218.

Kostis et al. ("Effect of the Oxygen Sub-Stichiometry and of Hydrogen Insertion on the Formation of Intermediate Bands within the Gap of Disordered Molybdenum Oxide Dilms," J. of Physical Chemistry, 117, pp. 18013-18020, 2013) (Year: 2013).

Miika Mattinen et al., "Atomic Layer Deposition of Molybdenum and Tungsten Oxide Thin Films Using Heteroleptic mido-Amidinato Precursors: Process Development, Film Characterization, and Gas Sensing Properties," Chemistry of Materials, vol. 30, No. 23, 2018, pp. 8690-8701.

Rémi Vallat et al., "Selective deposition of Ta2O5 by adding plasma etching super-cycles in plasma enhanced atomic layer deposition steps," Journal of Vacuum Science & Technology A, vol. 35, No. 1, 2017, 01B104, 7 pp.

Sampson et al. ("Inhibiting Metal Oxide Atomic Layer Deposition: Beyond Zinc Oxide," Applied Materials and Interfaces, 9, pp. 33429-33436, 2017) (Year: 2017).

Wei et al. ("Sub-stoichiometry-facilitated oxidation kinetics in a o-Tix C-doped Ti-based alloy, "Nature, npj Material Degradation, Jan. 2019) (Year: 2019).

\* cited by examiner

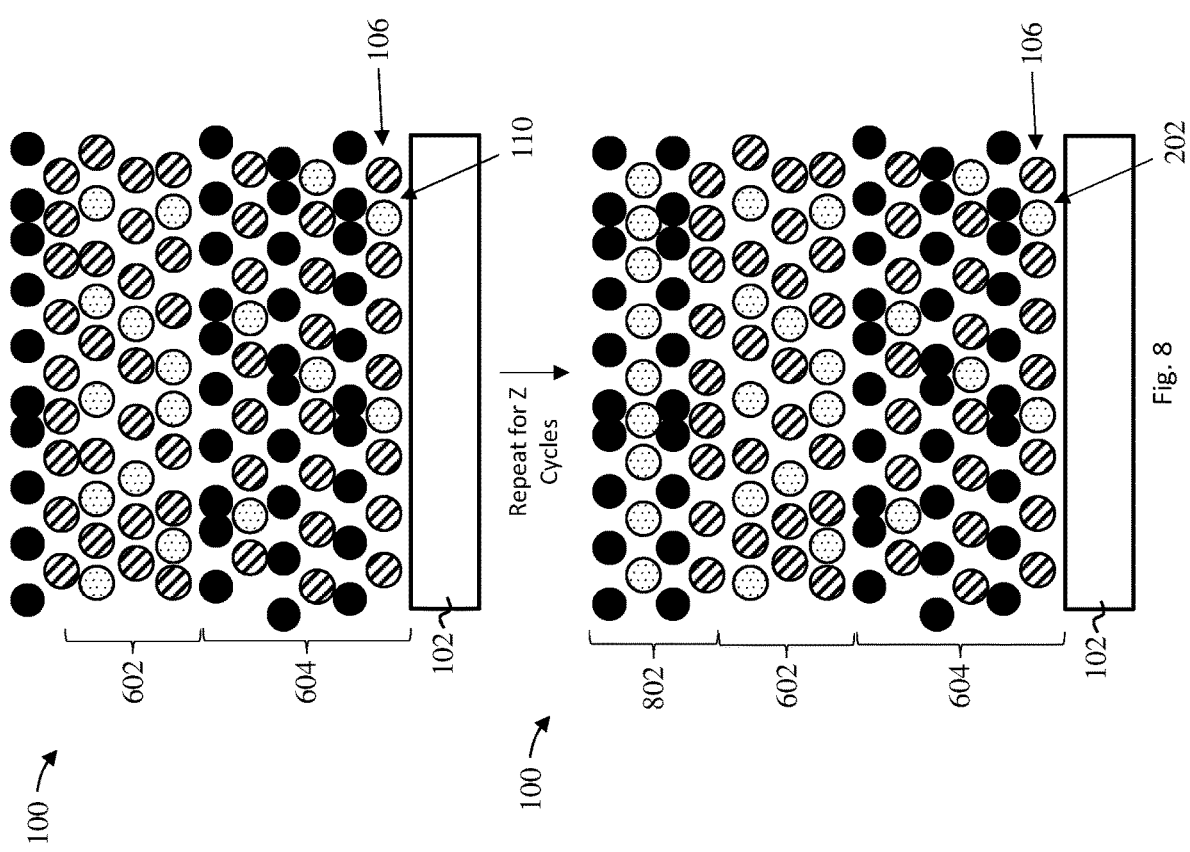

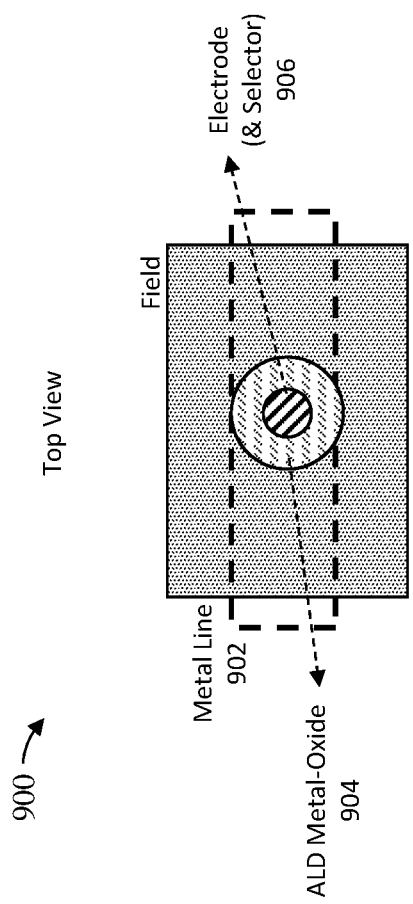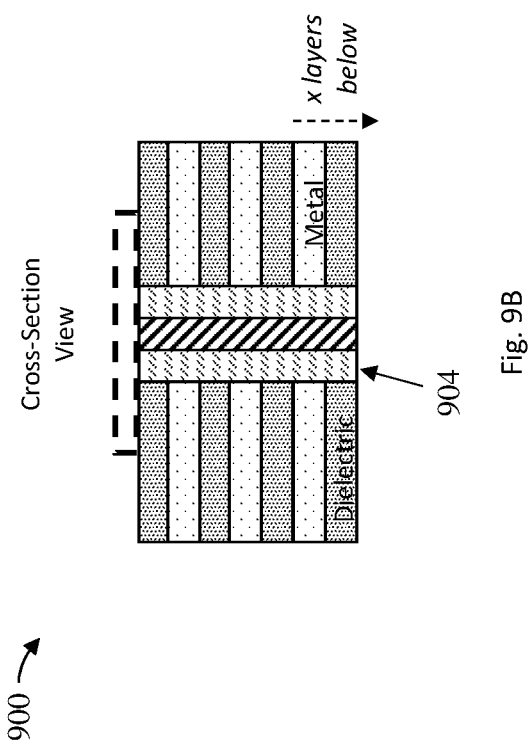

SUB-STOICHIOMETRIC METAL-OXIDE THIN FILMS

BACKGROUND

The present invention generally relates to film deposition techniques. More specifically, the present invention relates to the deposition of sub-stoichiometric metal-oxide thin films.

The semiconductor industry is characterized by a trend toward fabricating larger and more complex circuits on a given semiconductor chip. The larger and more complex circuits are achieved by reducing the size of individual devices within the circuits and spacing the devices closer together. In recent years, high dielectric constant (high-k) materials have gradually replaced silicon dioxide as the insulating layer used in state-of-the-art CMOS fabrication technologies, including, for example, the CMOS fabrication technologies used to fabricate memory cells in a semiconductor memory device. Zirconium oxide (ZrO), for example, has a dielectric constant from about 24 to 40. To meet the scaling requirements for smaller and smaller devices, these high-k films must be deposited to increasingly lower thickness levels.

Atomic layer deposition (ALD) is a deposition technique uniquely suited for thin-film deposition. During ALD a film is grown on a substrate layer by layer by exposing the substrate surface to alternating gaseous species, typically referred to as precursors. The precursors are deposited during a series of sequential, non-overlapping pulses. In each of these pulses the precursor molecules react with the surface in a self-limiting way so that the reaction terminates once all the reactive sites on the surface are consumed. Consequently, the maximum amount of material deposited on the surface after a single exposure to all of the precursors (a so-called ALD cycle) is determined by the nature of the precursor-surface interaction. By varying the number of cycles, it is possible to grow materials uniformly and with high precision on arbitrarily complex and large substrates.

SUMMARY

Embodiments of the invention are directed to a method for forming a sub-stoichiometric metal-oxide film using a modified atomic layer deposition (ALD) process. A non-limiting example of the method includes selecting a first precursor and a second precursor. The first precursor can include a metal and a first ligand. The second precursor can include the same metal and a second ligand. A substrate can be exposed to the first precursor during a first pulse of an ALD cycle. The substrate can be exposed to the second precursor during a second pulse of the ALD cycle. The second pulse can occur directly after the first pulse without an intervening oxidant. The substrate can be exposed to an oxidant during a third pulse of the ALD cycle.

In some embodiments of the invention, the oxidant is a non-plasma based thermal oxidant (e.g., $H_2O$, $O_3$, etc.). In some embodiments of the invention, the metal of the first precursor chemisorbs onto a surface of the substrate during the first pulse.

In some embodiments of the invention, the metal of the second precursor chemisorbs onto a coated surface terminated by the first precursor ligands. In some embodiments of the invention, the first ligand and the second ligand react during the second pulse to form one or more by-products. In some embodiments of the invention, at least a portion of the one or more by-products are removing using off-gassing.

In some embodiments of the invention, the second pulse occurs directly after the first pulse without an intervening pulse. In some embodiments of the invention, the second pulse occurs after the first pulse such that any intervening pulse is a non-reactive purge pulse.

Embodiments of the invention are directed to a method for depositing a sub-stoichiometric metal-oxide. A non-limiting example of the method includes exposing a substrate to a first ALD having a first precursor pulse, a second precursor pulse, and an oxidant pulse. The first precursor can include a metal and a first ligand and the second precursor can include the same metal and a second ligand. The method can include exposing the substrate to a second ALD cycle having the first precursor pulse and the second precursor pulse without an oxidant pulse. The method can include exposing the substrate to a third ALD cycle having one of (but not both of) the first precursor pulse and the second precursor pulse followed by an oxidant pulse.

In some embodiments of the invention, a super-cycle includes the first ALD cycle, the second ALD cycle, and the third ALD cycle in any order. The super-cycle can be repeated one or more times in the deposition of the sub-stoichiometric metal-oxide. In some embodiments of the invention, the first ALD cycle is repeated one or more times prior to the second ALD cycle. In some embodiments of the invention, the second ALD cycle is repeated one or more times prior to the third ALD cycle.

In some embodiments of the invention, the metal includes hafnium, the first ligand includes a chloride, and the second ligand includes a metalorganic. In some embodiments of the invention, the first precursor includes $HfCl_4$ and the second precursor includes hafnium and tetrakis-ethylmethylamino (TEMA). In some embodiments of the invention, the first precursor includes $TaCl_5$ and the second precursor includes tantalum and poly(2,5-dimethoxyaniline) (PDMA).

In some embodiments of the invention, the first ALD cycle and the second ALD cycle are sub-stoichiometric cycles and the third ALD cycle is stoichiometric.

Embodiments of the invention are directed to a method for forming a semiconductor structure. A non-limiting example of the method includes forming a bottom layer, a top electrode, and a metal-sub-oxide film between the bottom layer and the top electrode. The metal-sub-oxide film can be formed by exposing the bottom layer to an ALD cycle having a first precursor pulse, a second precursor pulse, and an oxidant pulse. The first precursor can include a metal and a first ligand and the second precursor can include the same metal and a second ligand.

In some embodiments of the invention, the metal-sub-oxide film is an active area of a resistive random-access memory (RRAM). In some embodiments of the invention, the metal-sub-oxide film is a gate dielectric layer of a floating gate flash memory.

Embodiments of the invention are directed to a semiconductor structure. A non-limiting example of the semiconductor device includes a bottom layer made of a semiconductor material, a top electrode, and a metal-sub-oxide film between the bottom layer and the top electrode. The metal-sub-oxide film can be formed by exposing the bottom layer to an ALD cycle having a first precursor pulse, a second precursor pulse, and an oxidant pulse. The first precursor can include a metal and a first ligand and the second precursor can include the same metal and a second ligand. In some embodiments of the invention, the semiconductor material includes one or more of Si, Ge, SiGe, aSi:H, and InGaAs.

Embodiments of the invention are directed to a semiconductor structure. A non-limiting example of the semiconductor device includes a bottom electrode having a first metal, a top electrode having a second metal, and a metal-sub-oxide film between the bottom electrode and the top electrode. The metal-sub-oxide film can be formed by exposing the bottom electrode to an ALD cycle having a first precursor pulse, a second precursor pulse, and an oxidant pulse. The first precursor includes a third metal and a first ligand and the second precursor includes the third metal and a second ligand.

In some embodiments of the invention, the bottom electrode includes a metal-nitride and the metal-sub-oxide film includes $HfO_{2-x}$ or $Ta_2O_{3-x}$. In some embodiments of the invention, the metal-sub-oxide film includes one or more metal-metal bonds and/or one or more metal-nitride-metal bonds. In some embodiments of the invention, the metal-sub-oxide film includes sub-oxide bonds coupled with organic and halide byproducts (e.g., C, Cl, $NH_3Cl$, etc.).

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 8 depicts a cross-sectional view of the structure after fabrication operations in accordance with embodiments of the invention;

FIG. 9A depicts a top-down view of a structure after fabrication operations in accordance with embodiments of the invention;

FIG. 9B depicts a cross-sectional view of the structure of FIG. 9A after fabrication operations in accordance with embodiments of the invention;

Figure 1:
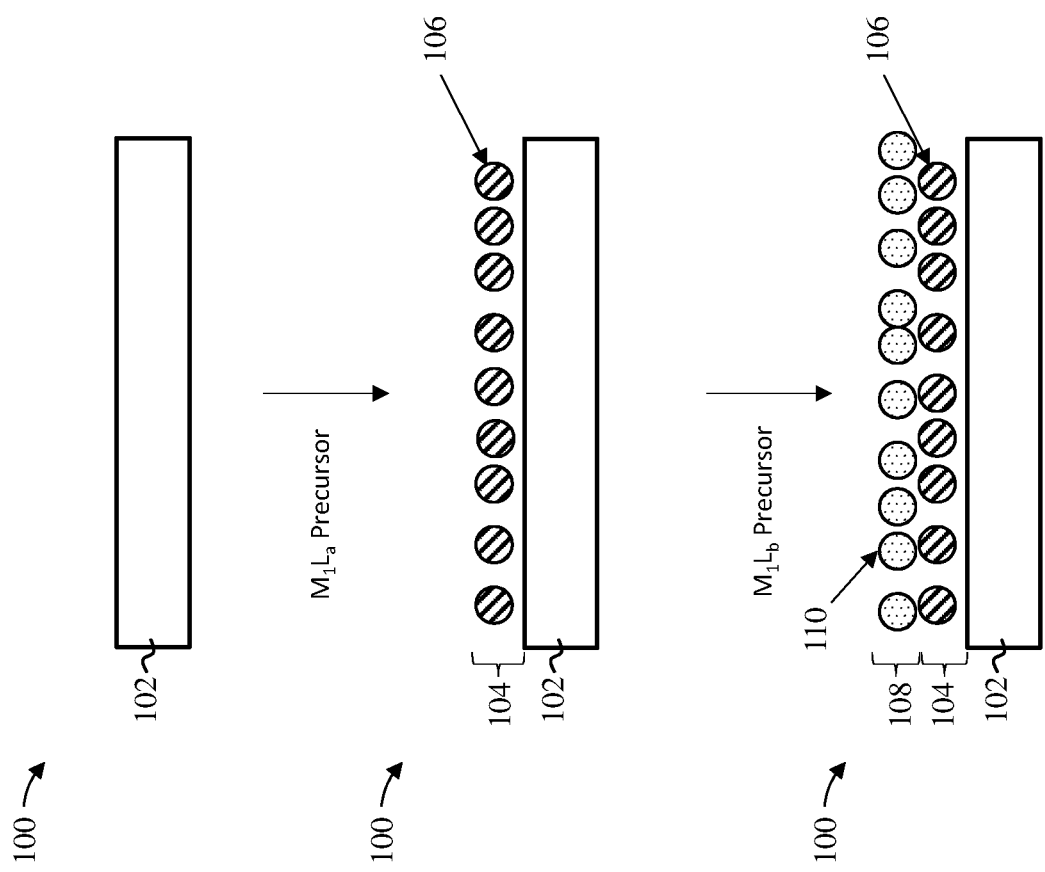
FIG. 1 depicts a cross-sectional view illustrating a structure that results from performing initial fabrication operations in accordance with embodiments of the invention.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, current atomic layer deposition (ALD) techniques for depositing suboxides rely on the introduction of plasma (either remote or direct). This leads to an incomplete, non-conformal, and non-uniform film deposition. Moreover, other, non-plasma based ALD techniques for mixed reactions having different metals and ligands are done in the absence of an oxidizer, meaning that these processes are limited to non-suboxides. Consequently, there are no existing paths to form conformal, uniform, single metal ALD suboxides that would be applicable to 3D technology such as flash and RRAMs in the absence of a scavenging gate, greatly limiting the number of available applications for ALD suboxides.

Turning now to an overview of the aspects of the invention, embodiments of the invention provide a new, fully thermal ALD technique for depositing thin-film suboxides with or without an intervening oxidant. A "fully thermal" ALD process refers to a process where no plasma is introduced during the ALD cycle. By avoiding the use of plasmas, a complete, conformal, uniform film deposition is possible. This process allows for the use of thermal oxidants (rather than plasma-based oxidants) and is therefore compatible with a wide range of current and future 3D technologies.

ALD techniques in accordance with aspects of the invention leverage mixed precursor reactions having the same metal but different ligands to form thin-film suboxides. Consider the deposition of ALD metal precursors P1 and P2, where P1 includes a first metal and a first ligand (e.g., M1La) and P2 includes the first metal and a second ligand (e.g., M1Lb). In some embodiments of the invention, M1Lb pulses occur right after M1La pulses, with or without intervening thermal oxidant (or other reactant) pulses. If no thermal oxidant (denoted "O") is used, the ALD cycle is combined with a standard metal-oxide ALD cycle in an ALD super-cycle.

In other words, the present fully thermal ALD technique includes M1La-M1Lb-O ALD cycles and (M1La-M1Lb-O).x+(M1La-M1Lb).y ALD super-cycles, where x and y can be arbitrarily repeated any number of times (i.e., x and y can each be 0, 1, 2, 3, 4, 5 . . . 10 . . . N, and x and y can have the same or a different value). In some embodiments of the invention, the (M1La-M1Lb-O).x and (M1La-M1Lb).y cycles are sub-stoichiometric ALD cycles.

In some embodiments of the invention, the ALD super-cycles are further modified to include a set of stoichiometric ALD cycles z after the sub-stoichiometric ALD cycles x and y. For example, (M1La-M1Lb-O).x+(M1La-M1Lb).y+(M1La or M1Lb).z ALD super-cycles, wherein z can also be arbitrarily repeated any number of times (i.e., x, y, and z can each be 0, 1, 2, 3, 4, 5 . . . 10 . . . N, and x, y, and z can have the same or different values). In some embodiments of the invention, the ALD cycles of the super-cycle can be arbitrarily reordered (aka, the first pulse, second pulse, and oxidant pulse can occur in any desired order).

ALD techniques in accordance with aspects of the invention can provide for the full coverage of a self-saturated M1La layer, followed by the full coverage of an M1Lb layer following the La-Lb reactions and the degassing of by-products. In some embodiments of the invention, the self-saturated M1La layer and the M1Lb layer define a bilayer. The stoichiometry of a film formed according to one or more embodiments can be tuned by modifying the intervening oxidants (e.g., $O_2$, $H_2O$, $O_3$, NO, $N_2O$, etc.) and/or by tuning the ALD cycles x, y, and z in the ALD super-cycle (x,y or x,y,z).

Benefits of this technique over prior ALD processes include the ability to form conformal and uniform sub-stoichiometric metal oxide materials without need for scavenging electrodes, composition tuning, and grading by modifying the x,y,z cycles of the super-cycle sequence. ALD techniques in accordance with aspects of the invention are front-end-of-line (FEOL) compatible due to the lack of need for plasma processes.

The present ALD technique has a wide range of practical applications, such as in metal-insulator-metal (MIM) stacks, 3D memory oxides, 3D flash devices, resistive random access memory (RRAM), or in high-k dielectric films, such as those used in FETs and MIMCAPs. For example, this process can be used to build a MIM stack having a metal sub-oxide (e.g. $HfO_{2-x}$ or $Ta_2O_{3-x}$) positioned between a top and bottom electrode (e.g., TiN). The metal sub-oxide can contain significant traces of N, Cl, C, H (by-products of ALD reactions) and M1-M1 metallic bonds. Moreover, the metal sub-oxide can be conformal (self-limited reactions and formed with no use of plasma). RRAM devices formed using this process can have lowered forming, set, and/or reset voltages.

Turning now to a more detailed description of aspects of the present invention, FIGS. 1-8 depict cross-sectional views of a portion of a semiconductor wafer/structure 100 after fabrication operations for forming a sub-stoichiometric metal-oxide stack (shown in FIG. 8) from an ALD process using (M1La-M1Lb-O).x+(M1La-M1Lb).y+(M1La or M1Lb).z ALD super-cycles according to embodiments of the invention. More specifically, FIG. 1 depicts a cross-sectional view illustrating three instances of an initial wafer/structure/substrate 102 that results from performing initial fabrication operations in accordance with embodiments of this invention.

As shown in FIG. 1, a surface of the substrate 102 is exposed to a first precursor M1La to form a first ALD layer 104 during a first pulse of an ALD cycle. In some embodiments of the invention, the first ALD layer 104 includes the chemisorbed metal 106 of the first precursor M1La and its remaining ligands. In some embodiments of the invention, the first pulse results in the deposition of a single layer of the chemisorbed metal 106. In some embodiments of the invention, the first pulse is tuned (e.g., by modifying the pulse duration based on the selected precursor) to ensure that the surface of the substrate 102 is fully saturated (i.e., self-saturated) by the chemisorbed metal 106 (middle image). In some embodiments of the invention, formation of the first ALD layer 104 results in the substrate 102 having a coated surface terminated by the first precursor ligands La.

The substrate 102 can be made of any suitable substrate material, such as, for example, silicon, silicon germanium, silicon carbide (SiC), amorphous doped silicon (e.g., aSi:H), Group III-V compound semiconductor, Group II-VI compound semiconductor, or semiconductor-on-insulator (SOI). Group III-V compound semiconductors include materials having at least one group III element and at least one group V element, such as, for example, one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys. Group II-IV compound semiconductors include materials having at least one group II element and at least one group IV element, in a similar manner as Group III-V compound semiconductors. In some embodiments of the invention, the substrate 102 includes a buried oxide layer (not depicted). The buried oxide layer can be made of any suitable dielectric material, such as, for example, a silicon oxide. In some embodiments of the invention, the buried oxide layer is formed to a thickness of about 145 nm, although other thicknesses are within the contemplated scope of the invention.

The first precursor M1La can include a metal (M1) and a ligand (La). The metal can include any suitable material, such as, for example, Hf, Ta, Zr, Al, La, Si, etc. The ligand can include any suitable material, such as, for example, halides, a chloride ($Cl_4$ or $Cl_3$), or a metalorganic (trimethyl metalorganics, tetramethylethyl metalorganic, etc., such as $Al_2(CH_3)_6$).

While not illustrated for ease of discussion, in some embodiments of the invention, the first pulse (and in fact, any of the pulses, including all precursor and oxidant pulses) is followed by a non-reactive purge pulse. The purge pulse does not affect the final chemistry, and a detailed discussion of the purge pulses is omitted for simplicity. The purge pulses can include, for example, $N_2$, Ar, He, vacuum, etc., and can be used to purge off-gasses and unreacted precursor gasses.

As further shown in FIG. 1, the surface of the first ALD layer 104 is exposed to a second precursor M1Lb to form a second ALD layer 108 during a second pulse of an ALD cycle. In some embodiments of the invention, the second precursor M1Lb includes a same metal (M1) as the first precursor M1La. In some embodiments of the invention, the second precursor M1Lb includes a same metal (M1) but a different ligand (Lb) as the first precursor M1La.

In some embodiments of the invention, the different ligands La and Lb correspond to distinct halides and metal-organic ligands, including amines and carbo-hydrates. In some embodiments of the invention, the first ligand La and the second ligand Lb are selected from a same class of ligands (e.g., both are halides, metalorganics, etc.). In some embodiments of the invention, the first ligand La is selected from a first class of ligands (e.g., a halide) and the second ligand Lb is selected from a second class of ligands (e.g., a metalorganic). For example, the metal M1 can be hafnium (Hf) and the different precursors can include a combination of HfCl4, TEMAHf, and TDMAHf, etc., depending on the application. In another example, the metal M1 corresponds to tantalum (Ta) and the different precursors include a combination of $TaCl_5$, poly(2,5-dimethoxyaniline) tantalum (PDMAT), or n-terbutylim mido-tris(dietthylamino) tantalum (TBTDET).

In some embodiments of the invention, the first ligand La of the first precursor M1La reacts with the second ligand Lb of the second precursor M1Lb during the second pulse. In some embodiments of the invention, the reacted ligands La and Lb form an off-gas that is removed from the semiconductor structure 100. In some embodiments of the invention, what remains in the first ALD layer 104 after off-gassing is the metal M1 and some residuals (unreacted ligands and reaction by-products such as N, Cl, C, H).

In some embodiments of the invention, the second ALD layer 108 includes the chemisorbed metal 110 of the second precursor M1Lb and its remaining ligands. In some embodiments of the invention, the second pulse results in the deposition of a single layer of the chemisorbed metal 110. In some embodiments of the invention, the chemisorbed metal 110 of the second precursor chemisorbs, during the second pulse, onto the coated surface of the substrate 102 terminated by the first precursor ligands La.

In some embodiments of the invention, the second pulse is tuned (e.g., by modifying the pulse duration based on the selected precursor) to ensure that the surface of the first ALD layer 104 is fully saturated (i.e., self-saturated) by the chemisorbed metal 110 (bottommost image). In some embodiments of the invention, the first ALD layer 104 and the second ALD layer 108 form a single ALD bilayer 104/108. By building the stack layer by layer in this manner, the overall ALD process can be readily fine-tuned to meet a wide variety of process (composition, thickness, etc.) requirements.

Figure 2:
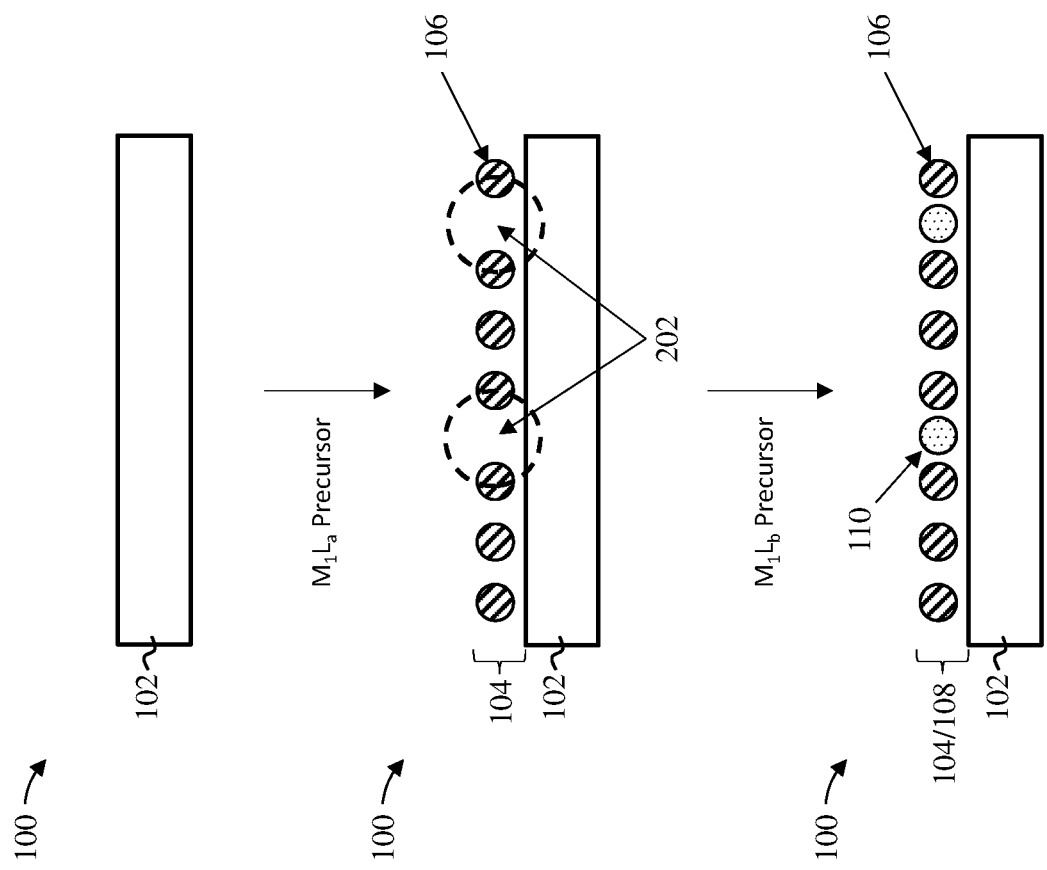
FIG. 2 depicts a cross-sectional view of the structure after fabrication operations in accordance with embodiments of the invention.

FIG. 2 depicts a cross-sectional view illustrating three instances of the semiconductor structure 100 after a processing operation according to one or more embodiments of the invention. While FIG. 1 illustrates the primary mechanism for the incorporation of metal during second M1Lb cycle (i.e., whereby the metal 110 chemisorbs onto the coated surface of the substrate 102 terminated by the first precursor ligands La), a second mechanism is possible. In some embodiments of the invention, the first precursor M1La and its remaining ligands can block some, but not all, of the adsorption/reaction sites (middle image). In some embodiments of the invention, one or more adsorption sites 202 remain open on the surface of the substrate 102.

As illustrated in FIG. 2, the surface of the substrate 102 is exposed to the second precursor M1Lb to fill in any (some, or all) of the one or more adsorption sites 202 in the first ALD layer 104 during a second pulse of an ALD cycle (bottommost image). In some embodiments of the invention, the second pulse immediately follows the first pulse.

By performing the second pulse right after the first pulse (i.e., by exposing the substrate 102 directly to the second precursor M1Lb without an oxidant pulse), the M1Lb uptake will be self-limited to the available reaction sites (e.g., the one or more open adsorption sites 202). In this manner, the first ALD layer 104 can be formed sub-stoichiometrically. In some embodiments of the invention, the chemisorbed metal 110 of the second precursor M1Lb reacts with the chemisorbed metal 106 of the first precursor M1La. In other words, the first ALD layer 104 can be a sub-oxide having M1-M1 metallic bonds. In some embodiments, the first ALD layer 104 can also include (in addition to M1-M1 metallic bonds) one or more of M1-C and M1-N bonds from precursor reaction by-products.

In some embodiments of the invention, the metal 110 chemisorbs via a combination of both the primary (chemisorb to the coated surface terminated by the first precursor ligands) and secondary mechanisms (chemisorb to open sites after the first pulse).

Figure 3:
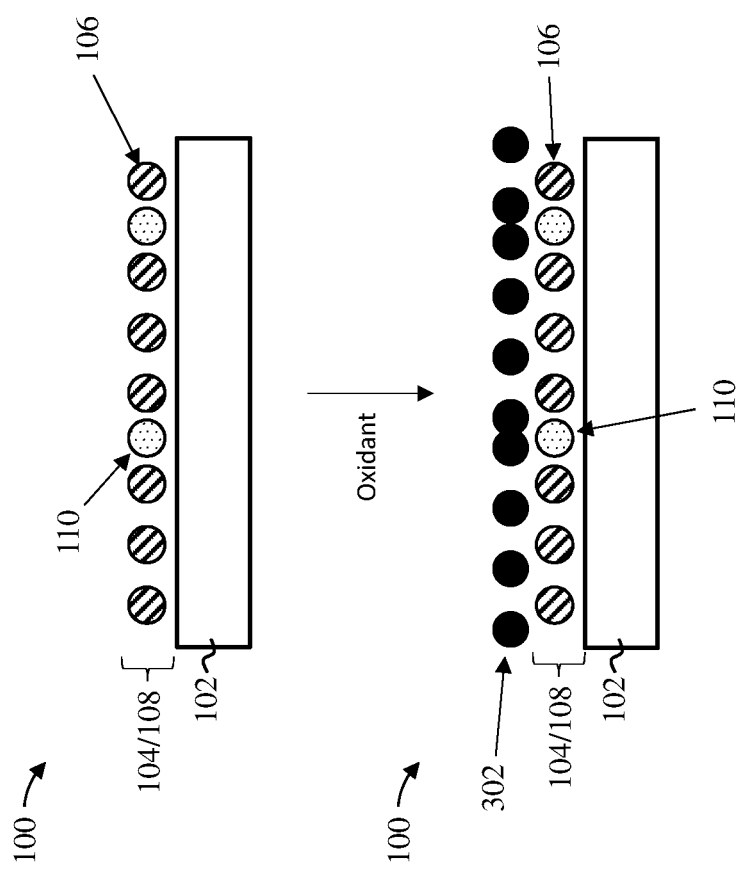
FIG. 3 depicts a cross-sectional view of the structure after fabrication operations in accordance with embodiments of the invention.

FIG. 3 depicts a cross-sectional view illustrating two instances of the semiconductor structure 100 after a processing operation according to one or more embodiments of the invention. As illustrated in FIG. 3, the surface of the first ALD layer 104 and the second ALD layer 108 (or bilayer 104/108, depending on how the second metal chemisorbs, discussed previously) is exposed to a thermal oxidant (O) during an oxidant pulse of the ALD cycle. In some embodiments of the invention, the thermal oxidant O can include, for example, $H_2O$, $N_2O$, NO, $O_3$, $O_2$, etc. In some embodiments of the invention, the oxidant pulse results in a single oxidant layer 302 forming on a surface of the first ALD layer 104 (bottom image).

Figure 4:
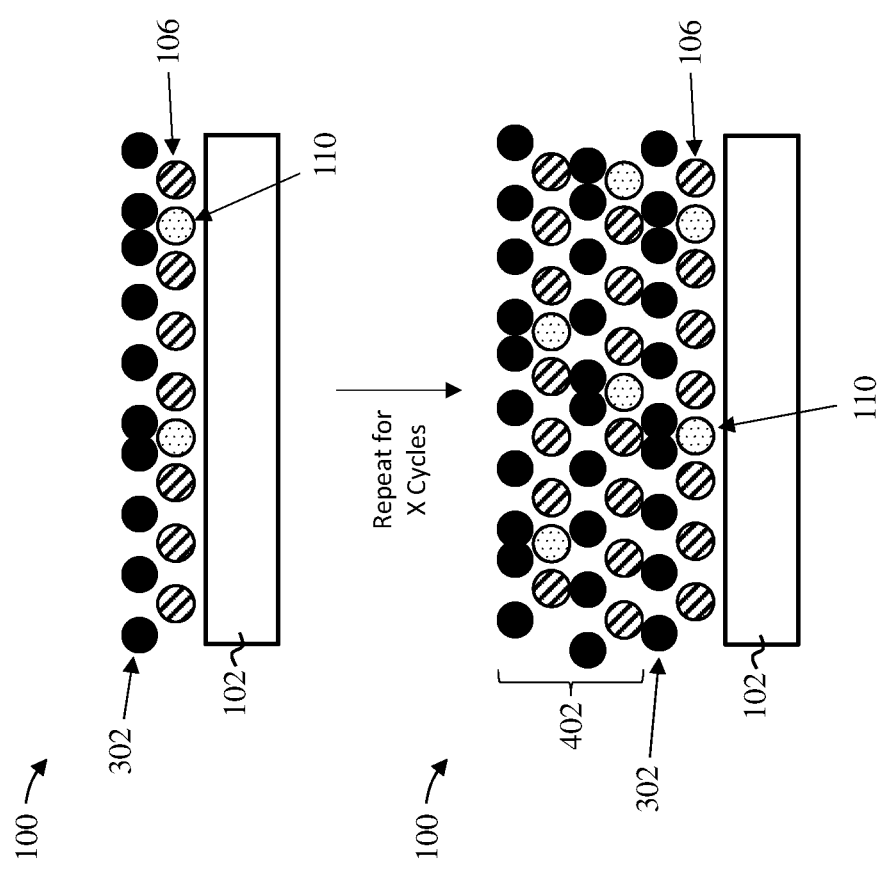
FIG. 4 depicts a cross-sectional view of the structure after fabrication operations in accordance with embodiments of the invention.

FIG. 4 depicts a cross-sectional view illustrating two instances of the semiconductor structure 100 after a processing operation according to one or more embodiments of the invention. As illustrated in FIG. 4, the semiconductor structure 100 is exposed to "X" repeated cycles of the ALD pulse (M1La-M1Lb-O) depicted in FIGS. 1-3 to build sub-stoichiometric layers 402 (bottom image).

In some embodiments of the invention, the sub-stoichiometric layers 402 are built by sequentially exposing the surface of the substrate 102 to: (1) a pulse of the first precursor M1La to form an ALD layer (as described with respect to FIG. 1); (2) a pulse of the second precursor M1Lb to fill in any (some, or all) of one or more adsorption sites in the ALD layer (as described with respect to FIG. 2); (3) a thermal oxidant pulse (as described with respect to FIG. 3); and (4) repeating as needed. The sub-stoichiometric layers 402 can be formed to any arbitrary thickness by increasing the number "X" of the repeated M1La-M1Lb-0 cycles as desired.

Figure 5:
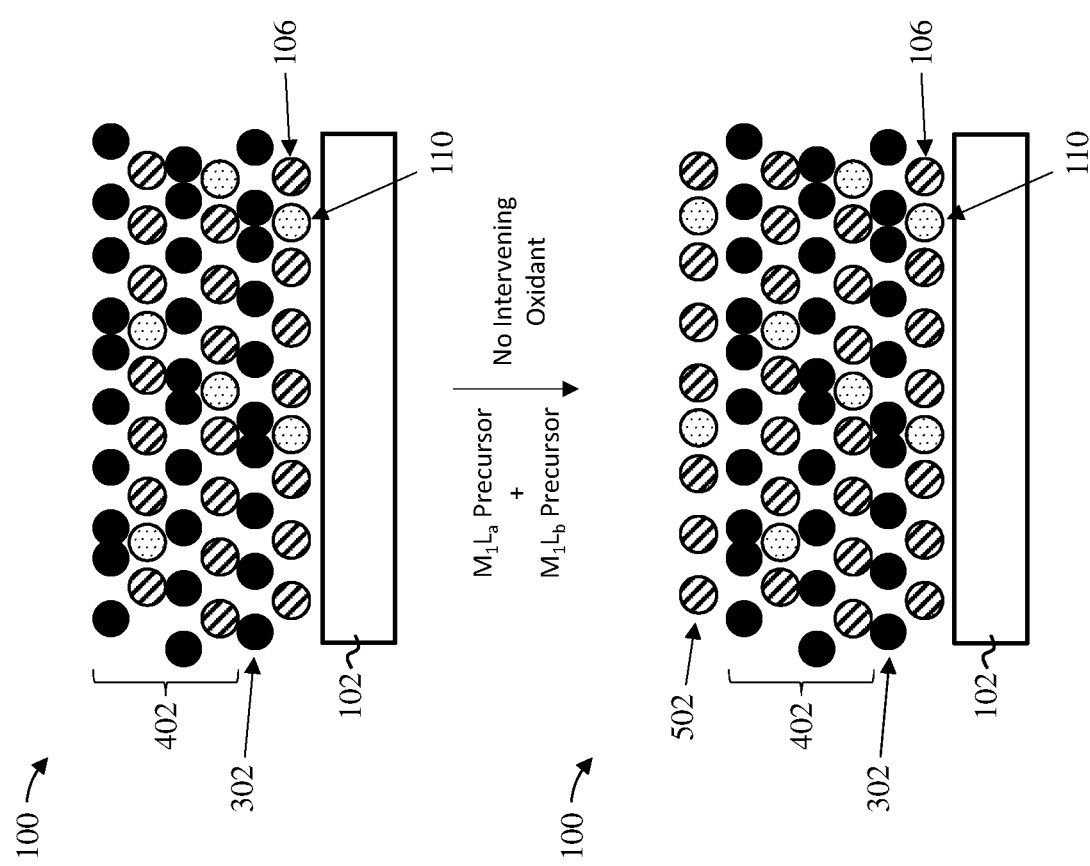
FIG. 5 depicts a cross-sectional view of the structure after fabrication operations in accordance with embodiments of the invention.

FIG. 5 depicts a cross-sectional view illustrating two instances of the semiconductor structure 100 after a processing operation according to one or more embodiments of the invention. In some embodiments of the invention, the ALD pulses (M1La-M1Lb-O).x are followed by a second ALD pulse without thermal oxidant pulses (i.e., M1La-M1Lb cycles). As illustrated in FIG. 5, during the second ALD pulse the semiconductor structure 100 is sequentially exposed to the first precursor and the second precursor to form a sub-stoichiometric layer 502 (bottom image).

Figure 6:
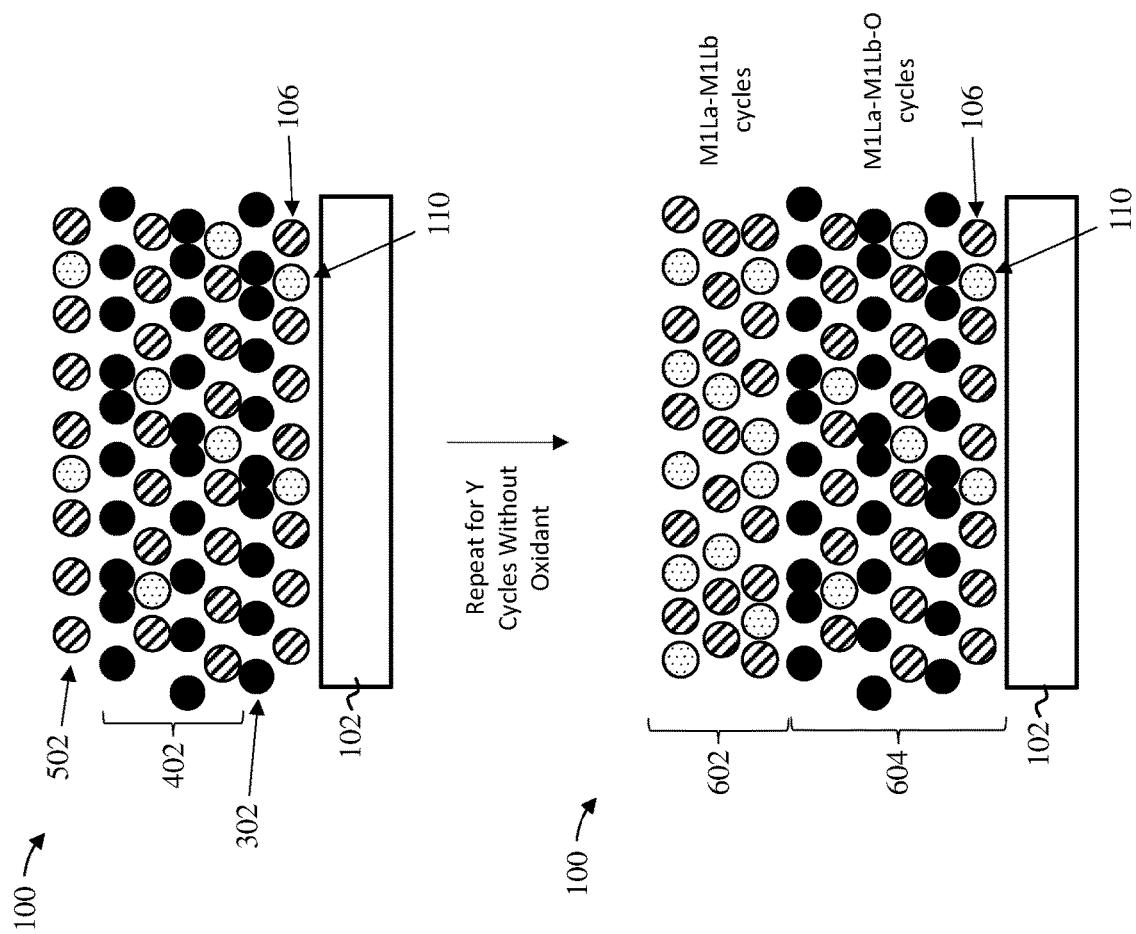
FIG. 6 depicts a cross-sectional view of the structure after fabrication operations in accordance with embodiments of the invention.

FIG. 6 depicts a cross-sectional view illustrating two instances of the semiconductor structure 100 after a processing operation according to one or more embodiments of the invention. As illustrated in FIG. 6, the semiconductor structure 100 is optionally exposed to "Y" repeated cycles of the ALD pulse (M1La-M1Lb) depicted in FIG. 5 to build additional sub-stoichiometric layers over the sub-stoichiometric layer 502, defining the sub-stoichiometric layers 602 (bottom image). As further shown in FIG. 6, the first ALD layer 104, the single oxidant layer 302, and the sub-stoichiometric layers 402 define a first set of sub-stoichiometric layers 604 under the sub-stoichiometric layers 602.

In some embodiments of the invention, the sub-stoichiometric layers 602 are built by sequentially exposing the surface of the substrate 102 to: (1) a pulse of the first precursor M1La to form an ALD layer (as described with respect to FIG. 1); (2) a pulse of the second precursor M1Lb to fill in any (some, or all) of one or more adsorption sites in the ALD layer (as described with respect to FIG. 2); and (3) repeating as needed (without a thermal oxidant cycle). The sub-stoichiometric layers 602 can be formed to any arbitrary thickness by increasing the number "Y" of the repeated M1La-M1Lb cycles as desired. As can be appreciated from FIG. 6, the ALD pulses (M1La-M1Lb).y differ from the ALD pulses (M1La-M1Lb-O).x due to the lack of the intervening thermal oxidant cycles.

Figure 7:
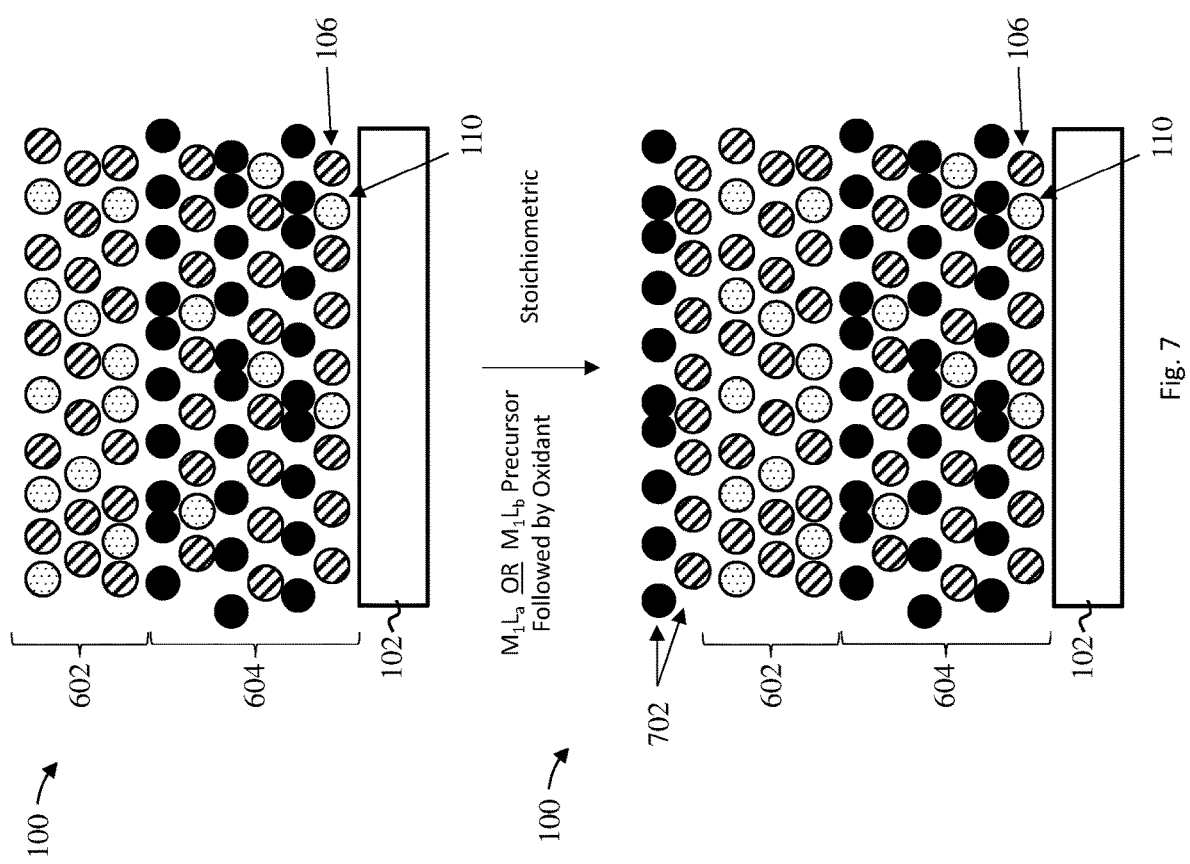
FIG. 7 depicts a cross-sectional view of the structure after fabrication operations in accordance with embodiments of the invention.

FIG. 7 depicts a cross-sectional view illustrating two instances of the semiconductor structure 100 after a processing operation according to one or more embodiments of the invention. As illustrated in FIG. 7, the semiconductor structure 100 is exposed to a third ALD pulse (M1La-O or M1Lb-O) to form one or more stoichiometric layers 702 on the sub-stoichiometric layers 602 (bottom image). In some embodiments of the invention, the third ALD pulse includes M1La pulses followed by O pulses. In some embodiments of the invention, the third ALD pulse includes M1Lb pulses followed by O pulses.

FIG. 8 depicts a cross-sectional view illustrating two instances of the semiconductor structure 100 after a processing operation according to one or more embodiments of the invention. As illustrated in FIG. 8, the semiconductor structure 100 is optionally exposed to "Z" repeated cycles of the third ALD pulse (M1La-O or M1Lb-O) depicted in FIG. 7 to build additional stoichiometric layers over the stoichiometric layer 702, defining the stoichiometric layers 802 (bottom image).

In some embodiments of the invention, the stoichiometric layers 802 are built by sequentially exposing the surface of the substrate 102 to: (1) a pulse of the first precursor M1La or the second precursor M1Lb to form an ALD layer; (2) a thermal oxidant pulse (as described with respect to FIG. 3); and (4) repeating as needed. The stoichiometric layers 802 can be formed to any arbitrary thickness by increasing the number "Z" of the repeated M1La/M1Lb-O cycles as desired. As can be appreciated from FIG. 8, the third ALD pulses (M1La/M1Lb-O) differ from the first ALD pulses (M1La-M1Lb-O) as only one of the precursors is included in each layer and differ from the second ALD pulses (M1La-M1Lb) due to the presence of the intervening thermal oxidant cycles.

FIGS. 9A and 9B depict top-down and cross-sectional views, respectively, of a semiconductor structure 900 after a processing operation according to one or more embodiments of the invention. As illustrated in FIG. 9A, the semiconductor structure 900 can define part of a MIM structure (e.g., planar X-point or stacked 3D RRAM). The semiconductor structure 900 can include, for example, a metal line 902, a sub-stoichiometric ALD metal-oxide 904, and an electrode 906. The metal line 902 and the electrode 906 can be formed using known processes. In some embodiments of the invention, the sub-stoichiometric ALD metal-oxide 904 is formed according to one or more embodiments of the invention. In some embodiments of the invention, the sub-stoichiometric ALD metal-oxide 904 is formed sequentially using "X" (M1La-M1Lb-O) cycles, "Y" (M1La-M1Lb) cycles, and "Z" (M1La/M1Lb-O) cycles of a super-cycle X-Y-Z, as discussed previously herein.

The semiconductor structure 900 illustrates one possible application for the sub-stoichiometric ALD metal-sub-oxides formed using the previously described techniques. It is understood, however, that the previously described techniques can be incorporated in other processes. Advantageously, this sub-oxide ALD technique can replace or supplement any FEOL or BEOL process whereby oxide films or sub-oxide films are needed (e.g., the high-k dielectric film in FETs, the insulator of a MIMCAP, etc.). In another example, the silicon nitride in a 3D charge-trap flash memory is replaced with an ALD sub-stoichiometric metal-oxide film (e.g., MO—N,C,H,Cl) formed according to one or more embodiments of the invention.

Figure 10:
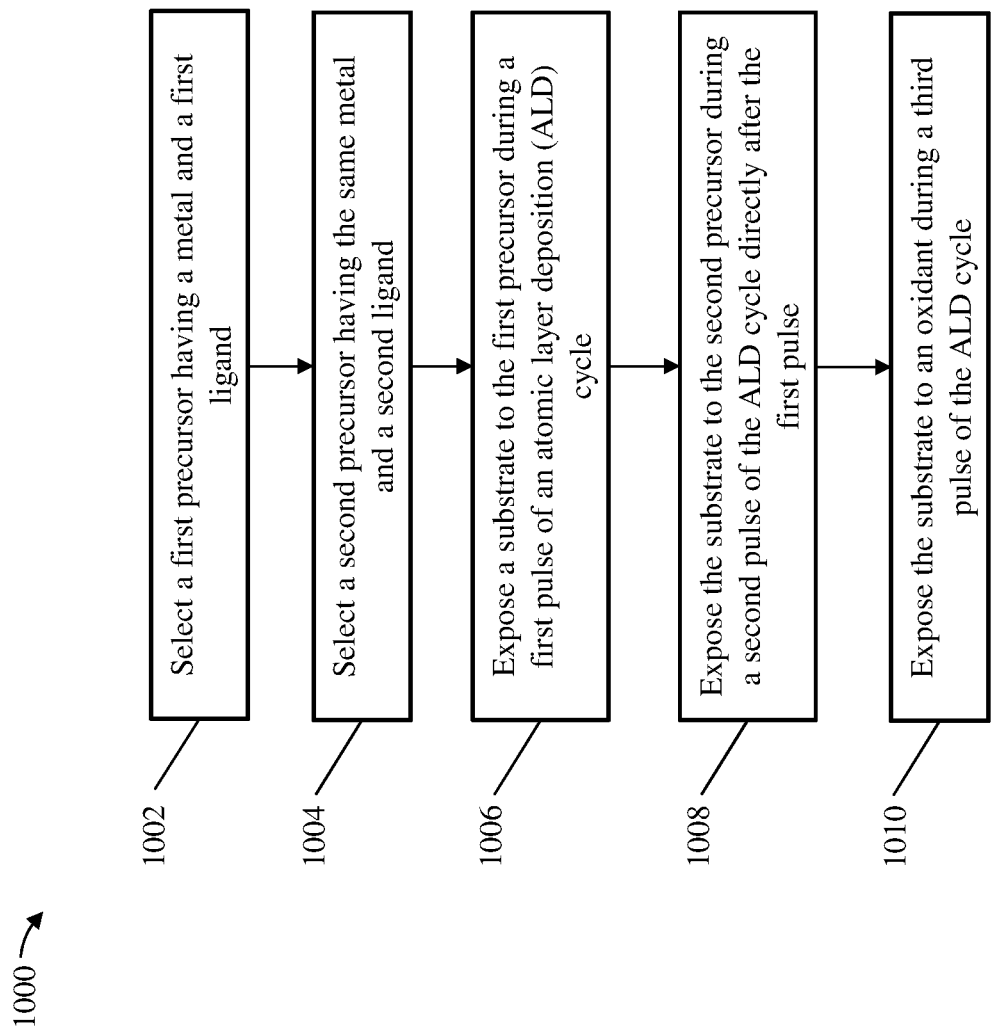
FIG. 10 depicts a flow diagram illustrating a method according to one or more embodiments of the invention.

FIG. 10 depicts a flow diagram 1000 illustrating a method for depositing a sub-stoichiometric metal-oxide according to one or more embodiments of the invention. As shown at block 1002, a first precursor is selected. The first precursor can include a metal and a first ligand. At block 1004, a second precursor is selected. The second precursor can include the same metal and a second ligand. In some embodiments of the invention, the metal includes one or more of Hf, Ta, Zr, Al, La, and Si. In some embodiments of the invention, the first ligand and the second ligand are selected from a same class (e.g., both chlorides). In some embodiments of the invention, the first ligand and the second ligand are selected from a different class (e.g., one chloride and one halide). In some embodiments of the invention, the first ligand includes a halide and the second ligand includes a metalorganic. In some embodiments of the invention, the first ligand includes a metalorganic and the second ligand includes a halide.

At block 1006, a substrate is exposed to the first precursor during a first pulse of an ALD cycle. In some embodiments of the invention, during the first pulse the metal of the first precursor chemisorbs onto a surface of the substrate. In some embodiments of the invention, one or more adsorption sites remain open after the first pulse.

At block 1008, the substrate is exposed to the second precursor during a second pulse of the ALD cycle. In some embodiments of the invention, the second pulse occurs directly after the first pulse. In some embodiments of the invention, the second pulse occurs after the first pulse such that any intervening pulse is a non-reactive purge pulse (e.g., without an intervening oxidant pulse).

In some embodiments of the invention, during the second pulse the metal of the second precursor chemisorbs onto a coated surface terminated by the first precursor ligands. In some embodiments of the invention, the first ligand and the second ligand react during the second pulse to form one or more by-products. In some embodiments of the invention, at least a portion of the one or more by-products are removed via off-gassing.

At block 1010, the substrate is exposed to an oxidant (e.g., thermal oxidant, O2, N2O, etc., as discussed previously herein) during a third pulse of the ALD cycle.

Figure 11:
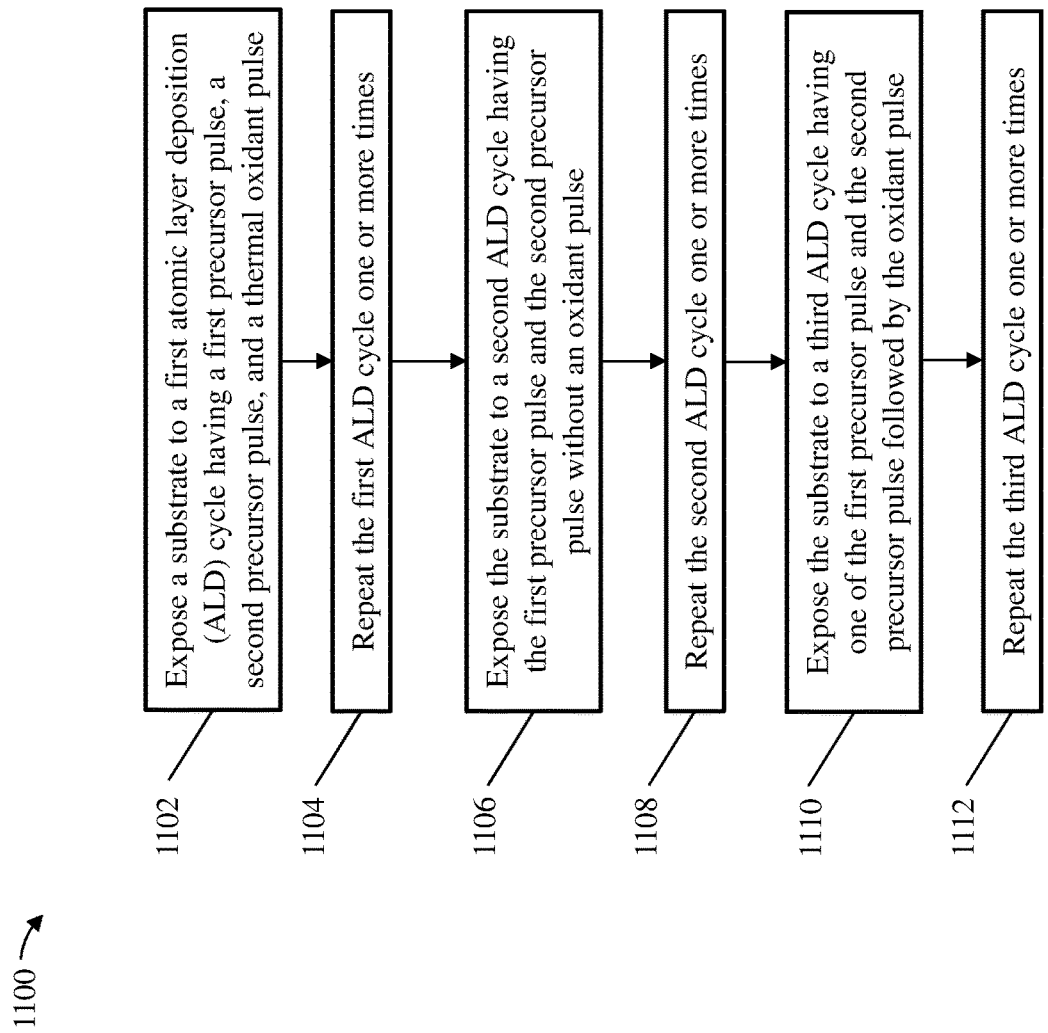
FIG. 11 depicts a flow diagram illustrating a method according to one or more embodiments of the invention.

FIG. 11 depicts a flow diagram 1100 illustrating a method for depositing a sub-stoichiometric metal-oxide according to one or more embodiments of the invention. As shown at block 1102, a substrate is exposed to a first ALD cycle having a first precursor pulse, a second precursor pulse, and an oxidant pulse (i.e., the M1La-M1Lb-O cycle described previously herein). The first precursor can include a metal and a first ligand and the second precursor can include the same metal and a second ligand. In some embodiments of the invention, the metal includes tantalum, the first ligand includes a chloride, and the second ligand includes a metalorganic. In some embodiments of the invention, the first precursor includes $HfCl_4$ and the second precursor includes hafnium and tetrakis-ethylmethylamino (TEMA). In some embodiments of the invention, the first precursor includes TaCl₅ and the second precursor includes tantalum and poly (2,5-dimethoxyaniline) (PDMA). At block 1104, the first ALD cycle is repeated one or more times.

At block 1106, the substrate is exposed to a second ALD cycle having the first precursor pulse and the second precursor pulse without a thermal oxidant pulse (i.e., the M1La-M1Lb cycle described previously herein). At block 1108, the second ALD cycle is repeated one or more times.

At block 1110, the substrate is exposed to a third ALD cycle having one of (not both of) the first precursor pulse and the second precursor pulse, followed by the thermal oxidant pulse (i.e., one of the M1La-O or M1Lb-O cycles described previously herein).

At block 1112, the third ALD cycle is repeated one or more times. In some embodiments of the invention, the repeated pulses are the same (e.g., all M1La-O or M1Lb-O cycles). In some embodiments of the invention, the repeated pulses vary (e.g., some M1La-O cycles and some M1Lb-O cycles). If varied, the M1La-O cycles and M1Lb-O cycles can be arbitrarily sequenced in any desired order (e.g., alternating or otherwise).

In some embodiments of the invention, a super-cycle includes the first ALD cycle, the second ALD cycle, and the third ALD cycle. In some embodiments of the invention, the super-cycle is repeated one or more times in the deposition of the sub-stoichiometric metal-oxide.

In some embodiments of the invention, the first ALD cycle and the second ALD cycle are sub-stoichiometric cycles and the third ALD cycle is stoichiometric.

Figure 12:
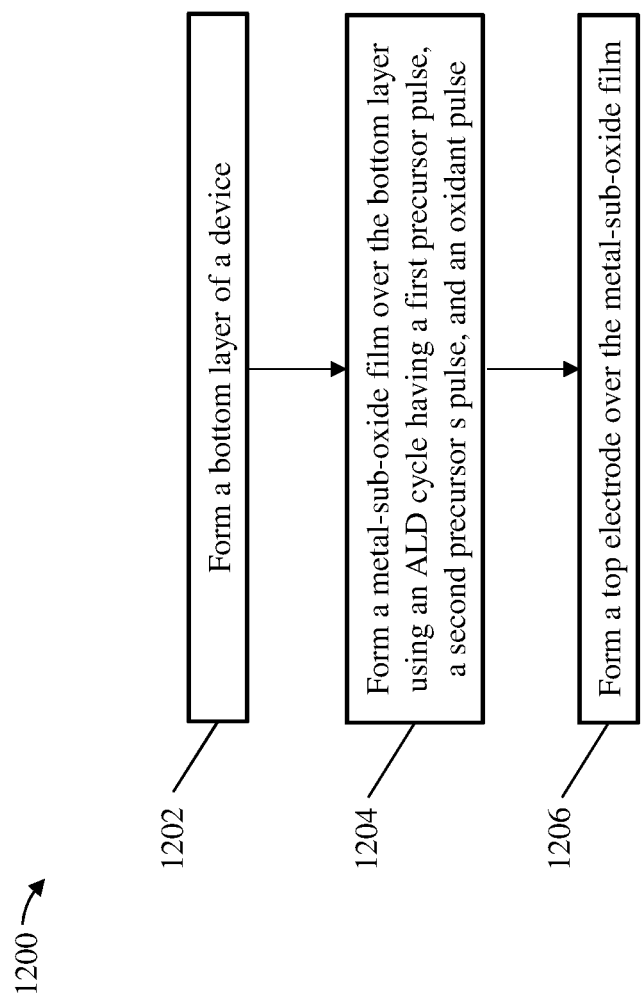
FIG. 12 depicts a flow diagram illustrating a method according to one or more embodiments of the invention.

FIG. 12 depicts a flow diagram 1200 illustrating a method for forming an electronic device having a sub-stoichiometric metal-oxide film according to one or more embodiments of the invention. As shown at block 1202, a bottom layer is formed. In some embodiments of the invention, the bottom layer includes a metal. In some embodiments of the invention, the bottom layer includes a semiconductor material. In some embodiments of the invention, the semiconductor material includes one or more of Si, Ge, SiGe, aSi:H, and InGaAs. In some embodiments of the invention, the bottom layer includes a bottom electrode. In some embodiments of the invention, the bottom electrode includes a metal. In some embodiments of the invention, the bottom electrode includes a metal-nitride and the metal-sub-oxide film includes $HfO_{2-x}$ or $Ta_2O_{3-x}$.

At block 1204, a metal-sub-oxide film is formed over the bottom layer. The metal-sub-oxide film can be formed by exposing the bottom layer to an ALD cycle having a first precursor pulse, a second precursor pulse, and a thermal oxidant pulse. The first precursor can include a metal and a first ligand, and the second precursor can include the same metal and a second ligand.

At block 1206, a top electrode is formed over the metal-sub-oxide film. In some embodiments of the invention, the bottom layer includes a metal and the metal-sub-oxide film is an active area of an RRAM. In some embodiments of the invention, the bottom layer includes a semiconductor and a dielectric, and the metal-sub-oxide film is a charge trapping layer of a floating gate flash memory.

In some embodiments of the invention, the metal-sub-oxide film is an active area of an RRAM. In some embodiments of the invention, the metal-sub-oxide film is a gate dielectric layer of a floating gate flash memory.

The methods described herein can be used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a (100) orientated crystalline surface can take on a (100) orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming an electronic device, the method comprising:
    forming a bottom layer;
    forming a metal-sub-oxide film over the bottom layer, the metal-sub-oxide film formed by exposing the bottom layer to an atomic layer deposition (ALD) cycle, the ALD cycle comprising a first precursor pulse, a second precursor pulse, and an oxidant pulse, wherein the first precursor comprises a metal and a first ligand and the second precursor comprises the metal and a second ligand; and
    forming a top electrode over the metal-sub-oxide film.

2. The method of claim 1, wherein the bottom layer comprises a metal and the metal-sub-oxide film comprises an active area of a resistive random-access memory (RRAM).

3. The device of claim 1, wherein the bottom layer comprises a semiconductor and a dielectric; and wherein the metal-sub-oxide film comprises a charge trapping layer of a floating gate flash memory.

4. The method of claim 1, wherein the oxidant is a non-plasma based thermal oxidant.

5. The method of claim 1, wherein during the first pulse the metal of the first precursor chemisorbs onto a surface of the substrate.

6. The method of claim 5, wherein during the second pulse the metal of the second precursor chemisorbs onto a coated surface terminated by the first precursor ligands; and wherein the first ligand and the second ligand react during the second pulse to form one or more by-products.

7. An electronic device comprising:
    a bottom layer;
    a top electrode; and
    a metal-sub-oxide film between the bottom layer and the top electrode, the metal-sub-oxide film formed by exposing the bottom layer to an atomic layer deposition (ALD) cycle, the ALD cycle comprising a first precursor pulse, a second precursor pulse, and an oxidant pulse, wherein the first precursor comprises a metal and a first ligand and the second precursor comprises the metal and a second ligand.

8. The device of claim 7, wherein the bottom layer comprises a metal electrode and the metal-sub-oxide film comprises an active area of a resistive random-access memory (RRAM).

9. The device of claim 7, wherein the bottom layer comprises a semiconductor and a dielectric layer; and wherein the metal-sub-oxide film comprises a charge trapping layer of a floating gate flash memory.

10. The device of claim 7, wherein the metal comprises one or more of Hf, Ta, Zr, Al, La, and Si, the first ligand comprises a halide, and the second ligand comprises a metalorganic.

11. The device of claim 7, wherein the metal comprises one or more of Hf, Ta, Zr, Al, La, and Si, the first ligand comprises a metalorganic, and the second ligand comprises a halide.

12. A metal-insulator-metal device comprising:
    a bottom electrode comprising a first metal;
    a top electrode comprising a second metal; and
    a metal-sub-oxide film between the bottom electrode and the top electrode, the metal-sub-oxide film formed by exposing the bottom electrode to an atomic layer deposition (ALD) cycle, the ALD cycle comprising a first precursor pulse, a second precursor pulse, and an oxidant pulse, wherein the first precursor comprises a third metal and a first ligand and the second precursor comprises the third metal and a second ligand.

13. The device of claim 12, wherein the bottom electrode comprises a metal-nitride and the metal-sub-oxide film comprises $HfO_{2-x}$ or $Ta_2O_{3-x}$.

14. The device of claim 12, wherein the metal-sub-oxide film comprises one or more metal-metal bonds and one or more metal-nitride-metal bonds; and wherein the metal-sub-oxide film further comprises sub-oxide bonds coupled with organic and halide byproducts.

15. The device of claim 12, wherein the metal-sub-oxide film comprises a sub-stochiometric film of a three-dimensional resistive random-access memory (RRAM), fin-type field effect transistor (finFET), or flash memory.

16. The device of claim 12, wherein the metal comprises one or more of Hf, Ta, Zr, Al, La, and Si, the first ligand comprises a halide, and the second ligand comprises a metalorganic.

17. The device of claim 12, wherein the metal comprises one or more of Hf, Ta, Zr, Al, La, and Si, the first ligand comprises a metalorganic, and the second ligand comprises a halide.

* * * * *